(12) United States Patent
Gandolfi et al.

(10) Patent No.: US 6,320,526 B1
(45) Date of Patent: Nov. 20, 2001

(54) SIGMA-DELTA ANALOG/DIGITAL CONVERTER WITH ADAPTIVE DITHER

(75) Inventors: Gabriele Gandolfi, Siziano; Vittorio Colonna, Landriano; Paolo Cusinato, Sestri Levante, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/615,100

(22) Filed: Jul. 13, 2000

(30) Foreign Application Priority Data

Jul. 19, 1999 (IT) .............................................. VA99A0022

(51) Int. Cl.[7] .................................................. H03M 1/66
(52) U.S. Cl. ........................................... 341/143; 341/131
(58) Field of Search ................................. 341/143, 144, 341/131, 155, 156

(56) References Cited

U.S. PATENT DOCUMENTS 4,811,019 * 3/1989 Julstrom et al. ..................... 341/143
4,968,987 * 11/1990 Naka et al. ........................... 341/143
5,073,777 * 12/1991 Fukuhara et al. .................... 341/131
5,124,706 * 6/1992 Gerdes .................................. 341/156
5,144,308 * 9/1992 Norsworthy .......................... 341/143
5,252,973 * 10/1993 Masuda ................................ 341/131
5,357,252 * 10/1994 Ledzius et al. ...................... 341/143
5,416,481 * 5/1995 Chen .................................... 341/131
5,457,714 * 10/1995 Engel et al. .......................... 341/143
5,745,061 * 4/1998 Norsworthy et al. ................ 341/131
5,872,532 * 2/1999 Yasuda ................................. 341/143

* cited by examiner

Primary Examiner—Peguy JeanPierre
Assistant Examiner—Jean Bruner Jeanglaude
(74) Attorney, Agent, or Firm—Lisa K. Jorgenson; Allen, Dyer, Doppelt, Milbrath & Gilchrist, P.A.

(57) ABSTRACT

An analog/digital $\Sigma\Delta$ converter has an input fed with an analog input signal, an output producing a digital signal representative of the analog input signal and a circuit for generating a dithering signal of amplitude adaptively regulated depending on the amplitude of the analog input signal. A comparator performs the regulation and uses a white noise dithering signal that is digitally generated and thereafter converted into an analog white noise dithering signal subjected to a second order filtering.

13 Claims, 10 Drawing Sheets

SIGMA-DELTA ANALOG/DIGITAL CONVERTER WITH ADAPTIVE DITHER

FIELD OF THE INVENTION

The present invention relates to signal processing systems and, more particularly, to sigma-delta ($\Sigma\Delta$) analog/digital converters.

BACKGROUND OF THE INVENTION $\Sigma\Delta$ analog/digital converters are commonly used in modern signal processing systems for converting analog input signals into digital signals, such as, for example, in audio applications and video systems. A typical drawback of $\Sigma\Delta$ converters is the phenomenon of intrinsic generation of tones that may be reflected back in the band of interest, for example the audio band, in presence of low dynamic input signals. Particularly undesirable are the tones near half a value of the sampling frequency because they have the greatest energetic content and are also more likely to be reflected back in the audio band as a consequence of nonlinearities and intermodulation effects.

Dithering techniques are commonly used to curb these undesirable phenomena. A dither signal, injected in the modulator that converts the analog signal into digital, has the function of making the error of the comparator of the analog/digital converter, often referred to as the modulator, as independent as possible from the input signal. Thus, the generation of tones and the resulting speed of their energy on the whole band may be averted.

Dithering techniques normally used in $\Sigma\Delta$ analog/digital converters are based on the injection of deterministic signals, whose energy is spectrally distributed outside the band of interest. The negative effect of dithering techniques manifests itself when the input signals are near the maximum design dynamic. The energy of the dither signal summed to that of the input signal to be converted may bring the stages of the modulator to operate under saturation conditions. In order to avert this problem, the dither signal may be attenuated or even deactivated in the presence of high dynamic input signals, implementing what is commonly referred to as an adaptive dither.

In the case of audio band converters, the most common signals being used are relatively continuous or sinusoidal signals of a frequency sufficiently above the band of the analog input signals being subject to analog/digital conversion. Continuous dither signals have a scarce effect, while the use of sinusoidal signals require a considerably more complex circuitry. Dither signals with a spectrum similar to white noise, notably very efficient for eliminating the tones, may be generated only digitally and for this reason are generally employed in digital/analog $\Sigma\Delta$ converters. A dithering signal, with a spectrum similar to that of white noise, has never been applied to analog/digital $\Sigma\Delta$ converters.

SUMMARY OF THE INVENTION

An object of this invention is to provide an analog/digital $\Sigma\Delta$ converter with an effective adaptive dither using a dithering signal with a spectrum similar to white noise. Fundamentally, the analog/digital $\Sigma\Delta$ converter of the invention has an input into which is fed an analog input signal, and an output producing a digital signal which represents the converted analog signal. Also, the converter includes a circuital for generating a dithering signal with an amplitude adaptively regulated as a function of the amplitude of the analog input signal as sensed by a comparator whose output effects the regulation. The converter of the invention uses a dithering signal that is digitally generated and which is thereafter converted into an analog noise having a spectrum substantially similar to that of white noise.

Indeed, to obtain a sensible reduction of spurious tones in the output signal spectrum, the dither signal must have a nonnegligible power compared to the maximum energy of the input signal. Filtering permits attenuation of the power level of the dither signal within the frequency band of interest, thus preserving the signal/noise ratio within acceptable limits. A second-order high-pass filtering in the digital domain may be implemented upstream of the converter or it may be implemented in the analog domain downstream of the digital/analog converter. The realization of a second-order high-pass digital filter requires a digital/analog converter with a relatively high number of bits. Conversely, the realization of a second-order analog filter implies a nonnegligible circuit complexity.

Most preferably, the filtering is carried out by using two first-order high-pass filters, a first filter realized in the digital domain upstream of the digital/analog converter and a second first-order high-pass filter coupled in cascade to the digital/analog converter in the analog domain of the dither signal. In this manner, the required filtering of the dither signal is implemented while conveniently limiting the number of bits of the digital/analog modulator (digital signal already pre-filtered) and of a first-order analog filter of considerably reduced complexity compared to that of a second-order filter is employed in cascade to the modulator.

According to a preferred embodiment, the circuit components needed for practicing the invention include a digital white noise generator, at least a digital divider of the signal produced by the generator coupled to the output of the generator, and a path selector having an input coupled to the output of the generator. Also included is at least a second input coupled to the output of the digital divider, controlled by the comparator of the analog input signal, a digital high-pass filter coupled in cascade to the path selector, and a digital/analog converter coupled in cascade to the digital filter. Furthermore, a high-pass analog filter is coupled in cascade to the digital/analog converter of the dither signal and whose output is coupled to a node of injection of the dithering signal of the $\Sigma\Delta$ analog/digital converter.

DETAILED DESCRIPTION OF THE PREFERRED EMBODIMENTS

Figure 1:
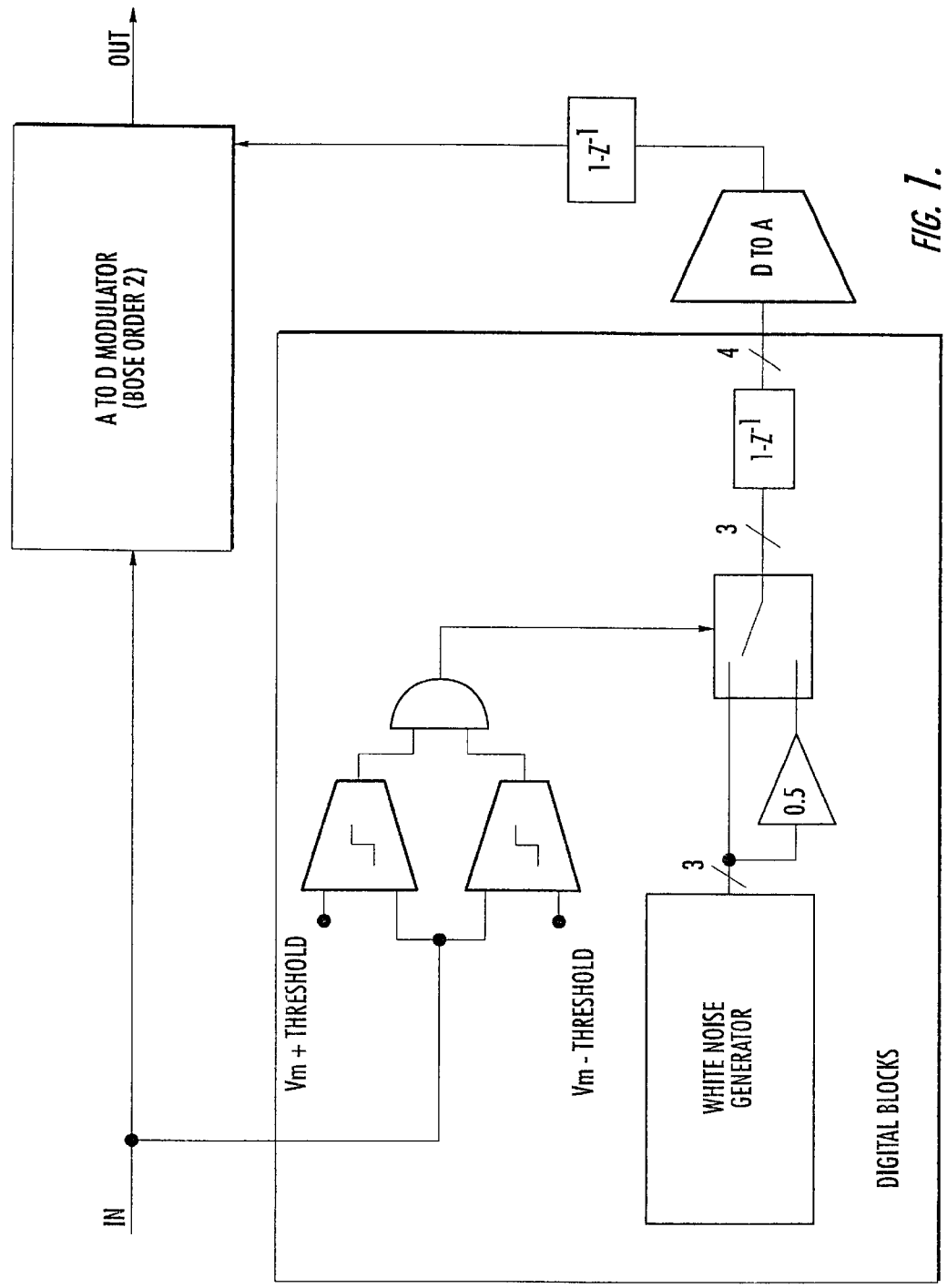
FIG. 1 is the basic diagram of an analog digital converter of the present invention.

With reference to FIG. 1, the block A to D MODULATOR which modulates the analog input signal In and outputs a digital signal OUT which represents the analog input signal may be any known $\Sigma\Delta$ converter. In the illustrated embodiment, a modulator referred to as second-order Boser modulator is used in which an analog dither signal is commonly injected. The adaptivity of the dithering may also be implemented according to a commonly known technique by using a comparator or preferably a window comparator, capable of detecting if the input analog signal In has an amplitude comprised in an interval, established by fixing the two trigger thresholds, positive and negative Vm+threshold and Vm−threshold, of the respective comparators, to generate a selection signal through an output logic gate.

Figure 2:
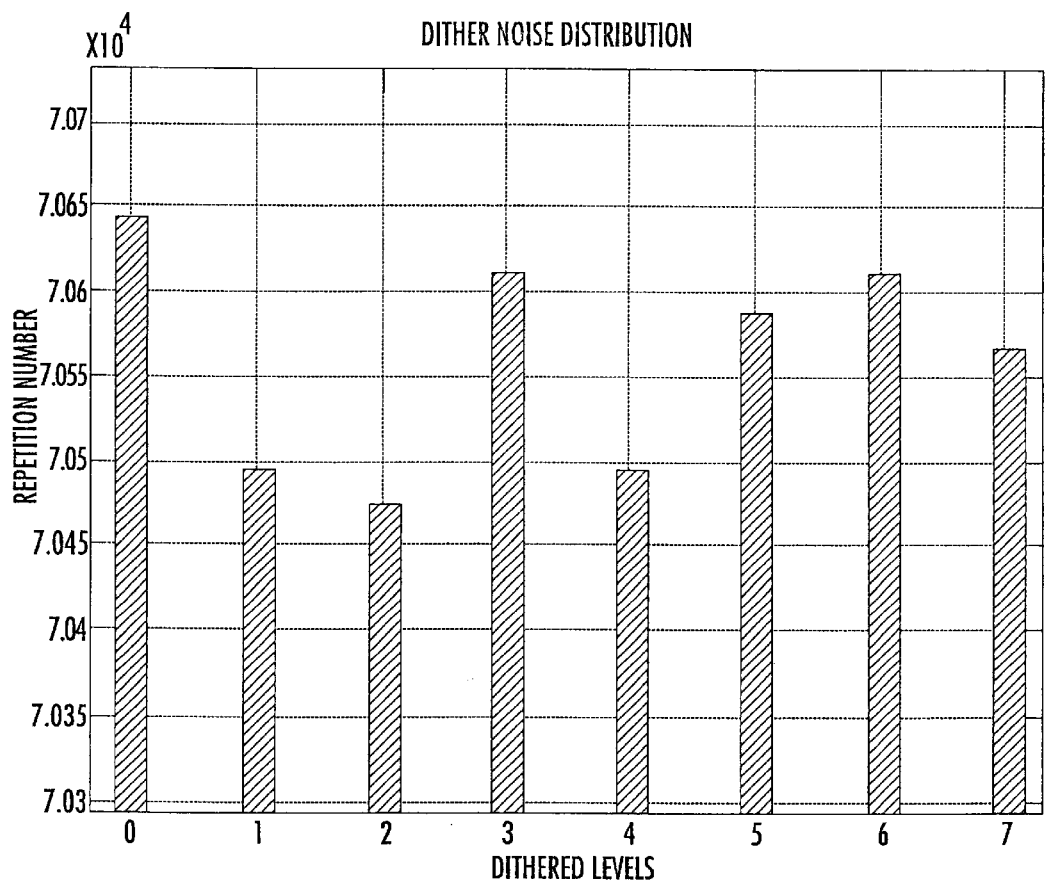
FIG. 2 is the diagram of an embodiment of a digital generator of white noise usable in the converter of the invention.
Figure 3:
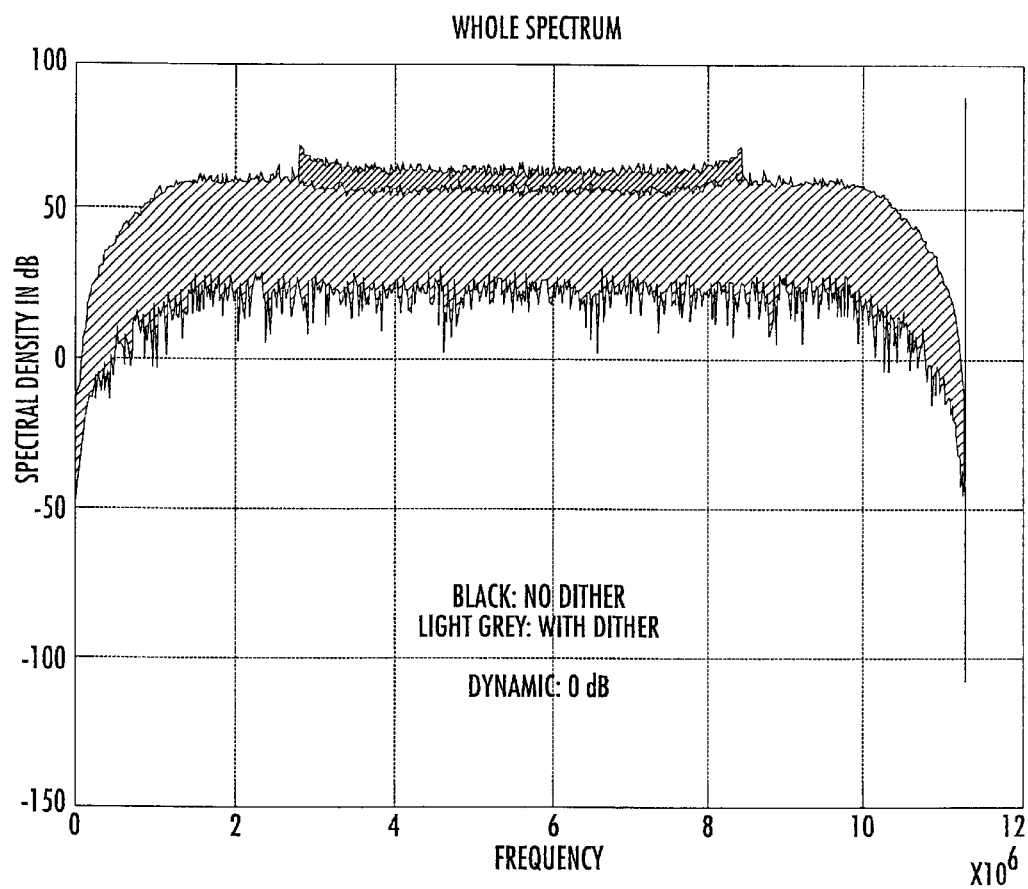
FIGS. 3 to 10 show the spectra of the modulator functioning with and without dither, for various dynamic ranges of the input signal.
Figure 4:
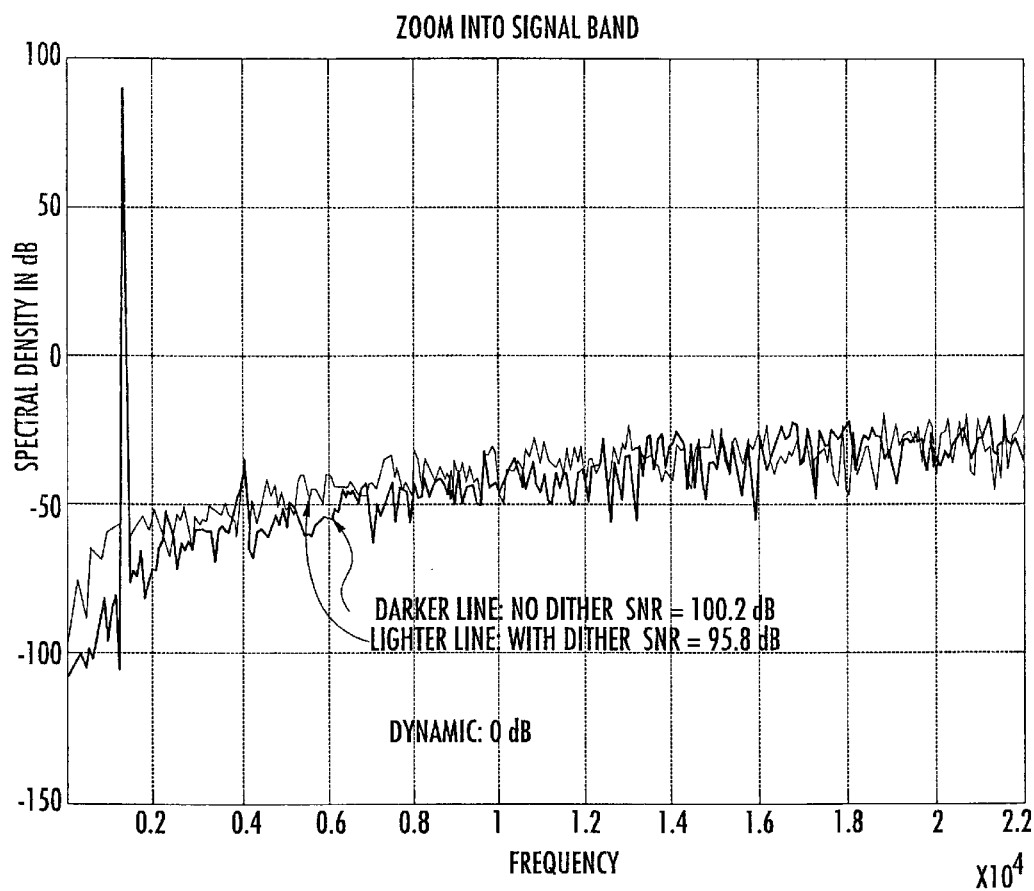
Figure 5:
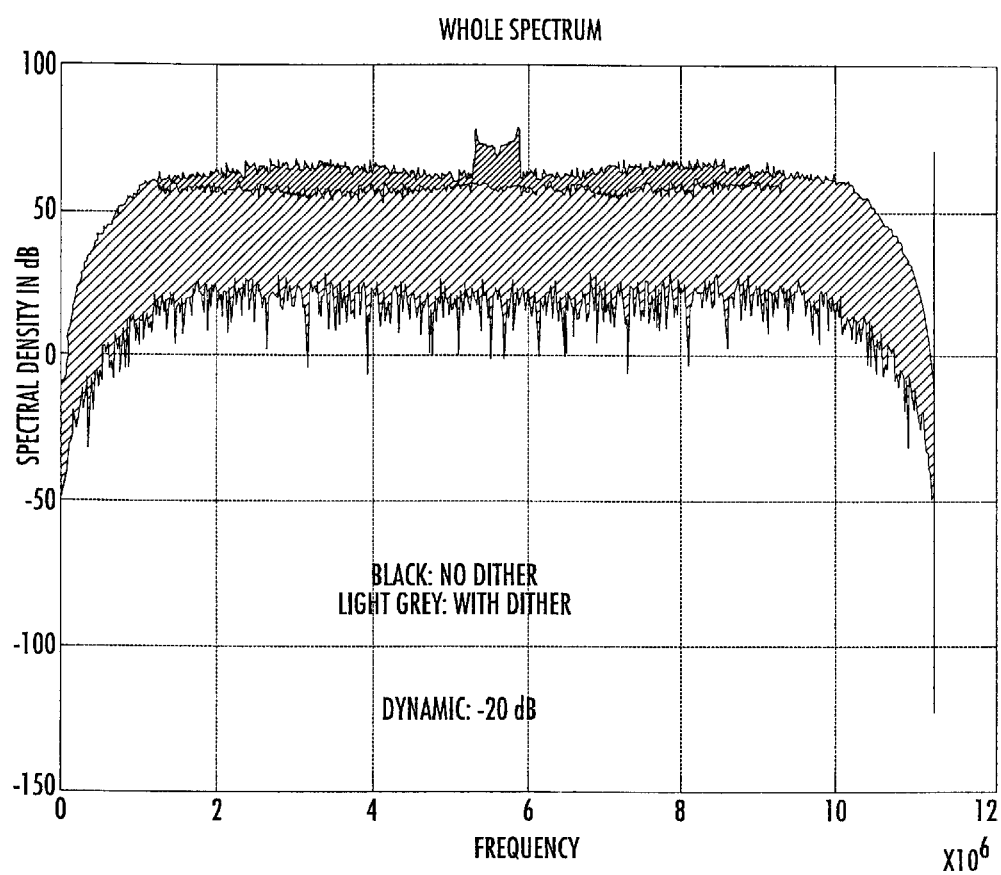
Figure 6:
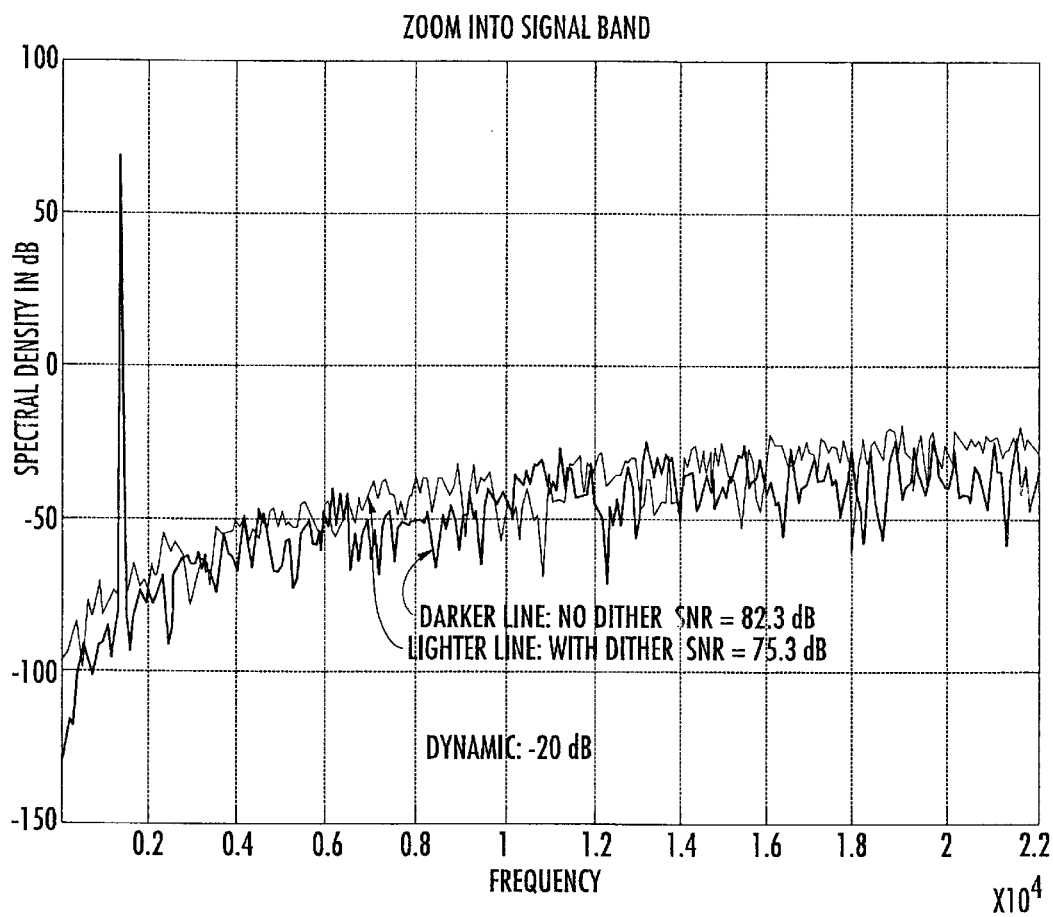
Figure 7:
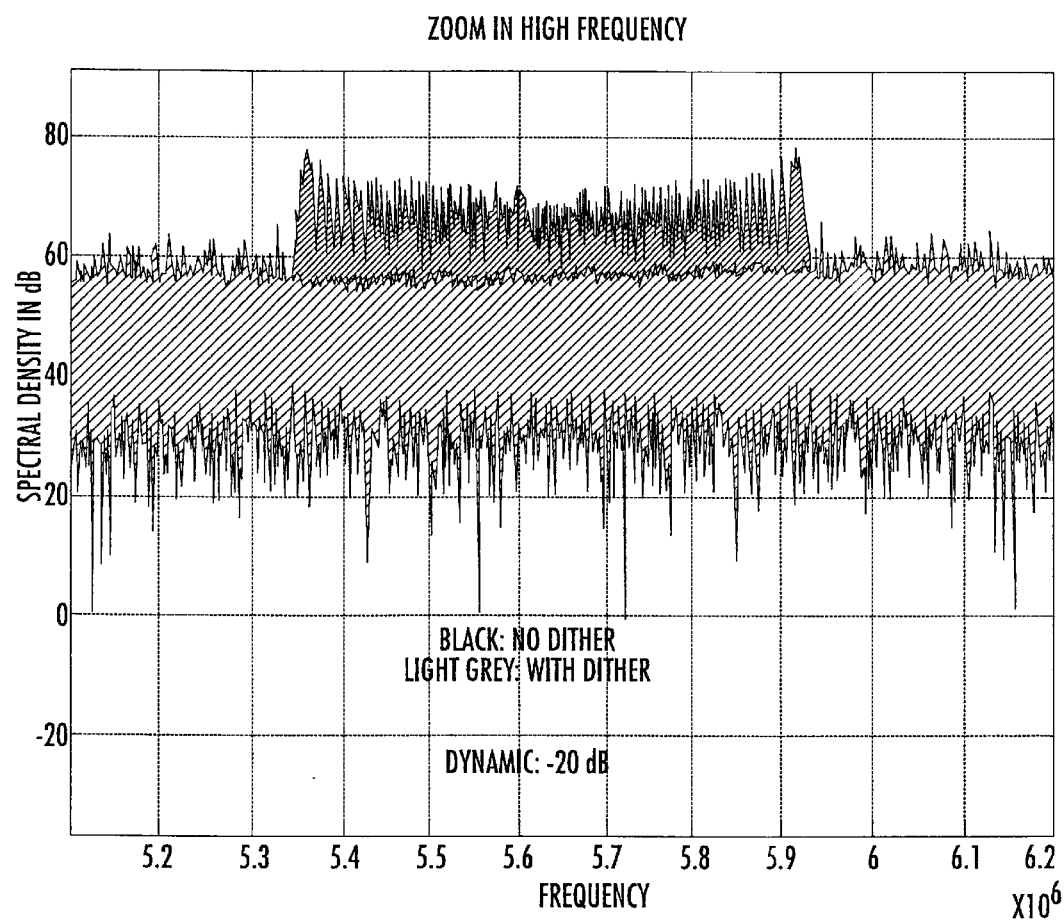
Figure 8:
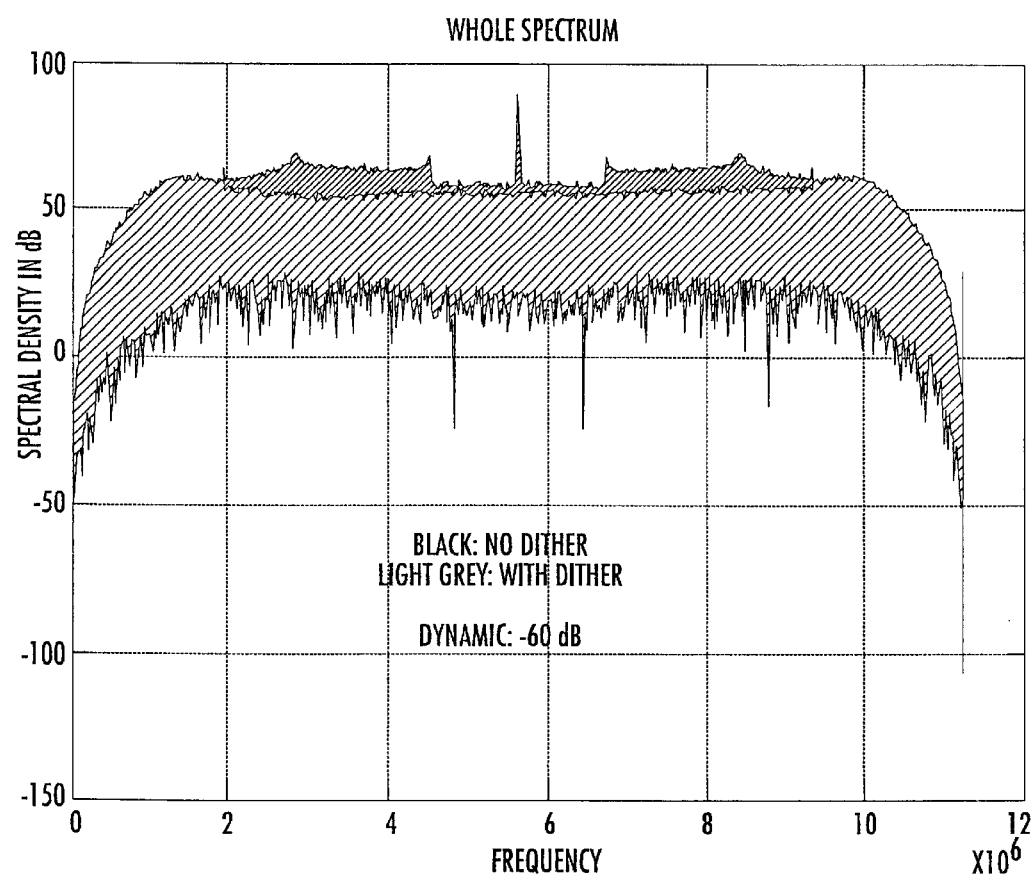
Figure 9:
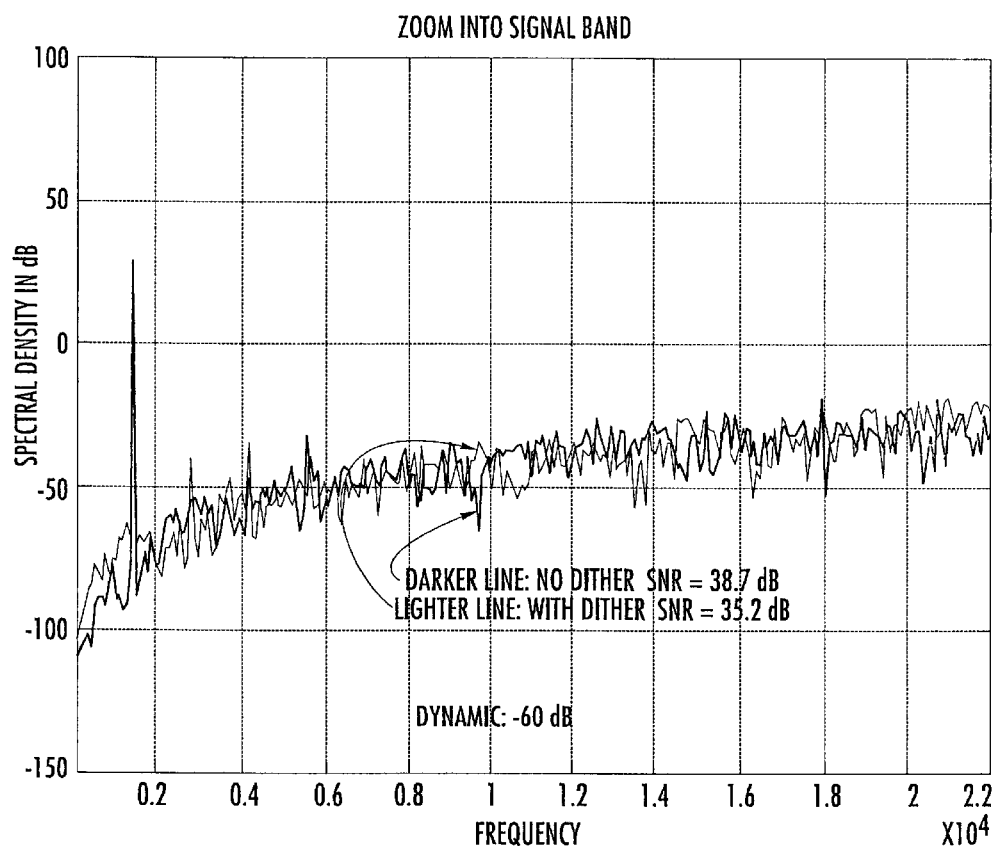
Figure 10:
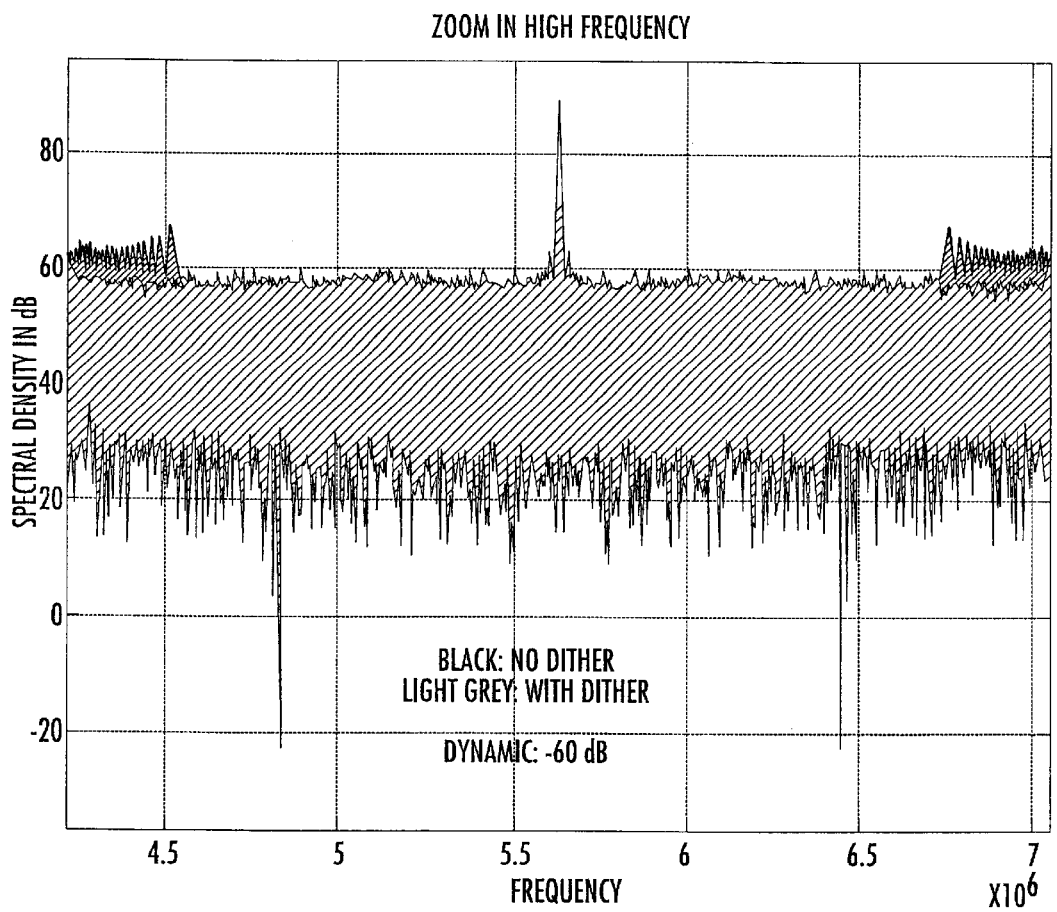

According to the invention, the structure comprises a digital generator of white noise NOISE GENERATOR. By way of example, the digital generator may be based on a polynomial of a sufficiently high order, for example of order 19, such to ensure a correspondingly vast periodicity, of $2^{19}\Delta t$, where $\Delta t$ represents the sampling period. The order of the polynomial is such to ensure that the repeating frequency is outside the band of interest, which in the considered example is the audio band. The last three bits of the chain of flip-flops of the polynomial generator are combined in a binary mode such to generate, as shown in FIG. 2, a sufficiently uniform statistical distribution of the output levels.

The adaptive function of the operated dithering is, in the illustrated example, implemented through a digital divider by two (0.5) of the white noise digital signal produced by the generator operating a selection of the dithering signal to be injected by selecting, via the signal produced by the comparator, a direct connection to the output of the digital generator of the white noise or to the output of the divider by two of the signal, as symbolically illustrated in FIG. 1. According to a preferred embodiment of the invention, the digitally generated white noise is subjected to a first digital filtering through the high-pass block $1\text{-}z^{-1}$ of the scheme of FIG. 1, before being converted into an analog noise by the digital/analog converter. A further high-pass analog filtering is thereafter carried by the $1\text{-}z^{-1}$ block in cascade to the output of the digital/analog converter. In practice, the dither signal, with a spectrum similar to white noise, is subjected to a second-order high-pass filtering, before being injected into the A to D MODULATOR.

MATLAB test simulations of a analog/digital $\Sigma\Delta$ converter of the present invention realized according to the functional scheme of FIG. 1 have confirmed an exceptional effectiveness of a dithering realized with a signal having a spectrum similar to that of white noise.

FIGS. 3–10 show the spectrums generated by the modulator of the invention, with and without dithering with white noise implemented according to the circuit structure of the invention. By observing the diagrams, it is evident that the presence of the dithering causes the tones to be attenuated by more than 20 dB while degradation of the in band signal/noise ratio is limited to less than 5 dB. Of course, for each circuit structure of the A to D MODULATOR it will be necessary to adapt the threshold voltage of the comparators, the power of the digitally generated dither signal, the filtering to be carried out on the dither signal in terms of the order and type of the filter mask, to attain the best compromise between the residual amplitude of spurious tones in the band of interest the signal/noise ratio and harmonic distortion near the input dynamic limit.

That which is claimed is:

1. A sigma-delta ($\Sigma\Delta$) analog/digital converter with adaptive dither comprising:
    an analog-to-digital modulator for generating a digital signal based upon an analog input signal;
    a comparator for detecting an amplitude of the analog input signal; and
    a dithering circuit for generating and injecting a dithering signal to the analog-to-digital modulator, the dithering signal having an amplitude adaptively regulated as a function of the amplitude of the analog input signal detected by the comparator, the dithering signal having a spectrum similar to white noise, said dithering circuit comprising
    a digital generator for generating a digital white noise signal,
    at least one digital divider connected to an output of the digital generator for dividing the digital white noise signal,
    a path selector having an input connected to the output of the digital generator, at least a second input connected to an output of the digital divider, and a selection input connected to an output of the comparator,
    a digital/analog converter connected to the path selector, and
    a filter, of at least a second-order, for filtering the dithering signal.

2. The $\Sigma\Delta$ analog/digital converter according to claim 1, wherein the filter comprises:
    a first first-order high-pass digital filter connected between the path selector and the digital/analog converter; and
    a second first-order high-pass analog filter connected between the digital/analog converter and an injection node of the analog-to-digital modulator.

3. The $\Sigma\Delta$ analog/digital converter according to claim 1, wherein the digital white noise signal generated by the digital generator has a repeating frequency which is outside the audio band.

4. The $\Sigma\Delta$ analog/digital converter according to claim 1, wherein the comparator comprises a window comparator for determining whether the amplitude of the analog input signal is between first and second thresholds.

5. A sigma-delta ($\Sigma\Delta$) analog/digital converter comprising:
    an analog-to-digital modulator for receiving an analog input signal and generating a digital signal based thereon;
    a comparator for detecting an amplitude of the analog input signal; and
    a dithering circuit generating and providing a dithering signal to the analog-to-digital modulator, said dithering circuit comprising
    a digital generator for generating a digital white noise signal,
    at least one digital divider connected to an output of the digital generator for dividing the digital white noise signal,
    a path selector having at least a first input connected to the output of the digital generator, a second input connected to an output of the at least one digital divider, and a selection input connected to an output of the comparator,
    a digital/analog converter connected to the path selector for outputting the dithering signal to the analog-to-digital converter, the dithering signal having an amplitude adaptively regulated as a function of the amplitude of the analog input signal detected by the comparator, and
    a filter for filtering the dithering signal.

6. The $\Sigma\Delta$ analog/digital converter according to claim 5, wherein the filter comprises:
    a first first-order high-pass digital filter connected between the path selector and the digital/analog converter; and a second first-order high-pass analog filter connected between the digital/analog converter and an injection node of the analog-to-digital modulator.

7. The ΣΔ analog/digital converter according to claim 5, wherein the digital white noise signal generated by the digital generator has a repeating frequency which is outside the audio band.

8. The ΣΔ analog/digital converter according to claim 5, wherein the comparator comprises a window comparator for determining whether the amplitude of the analog input signal is between first and second thresholds.

9. A method of performing a sigma-delta (ΣΔ) analog/digital conversion of an analog input signal, the method comprising:

detecting an amplitude of the analog input signal;

generating a digital white noise signal;

dividing the digital white noise signal to generate a divided digital white noise signal;

selecting, based upon the detected amplitude of the analog input signal, at least one of the digital white noise signal and the divided digital white noise signal as the dithering signal;

filtering and performing a digital-to-analog conversion of the dithering signal; and converting the analog input signal to a digital signal based upon the dithering signal.

10. The method according to claim 9, wherein the dithering signal has a spectrum similar to white noise.

11. The method according to claim 9, wherein filtering comprises:

performing a high-pass digital filtering of the dithering signal before the digital-to-analog conversion; and performing a high-pass analog filtering of the dithering signal after the digital-to-analog conversion.

12. The method according to claim 9, wherein the digital white noise signal has a repeating frequency which is outside the audio band.

13. The method according to claim 9, wherein detecting the amplitude of the analog input signal comprises determining whether the amplitude is between first and second thresholds.

\* \* \* \* \*